(12) United States Patent
Hino et al.

(10) Patent No.: US 10,546,800 B2
(45) Date of Patent: Jan. 28, 2020

(54) SEMICONDUCTOR MODULE, METHOD FOR MANUFACTURING THE SAME AND ELECTRIC POWER CONVERSION DEVICE

(71) Applicant: Mitsubishi Electric Corporation, Tokyo (JP)

(72) Inventors: Yasunari Hino, Tokyo (JP); Yuji Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/951,235

(22) Filed: Apr. 12, 2018

(65) Prior Publication Data

US 2019/0131210 A1 May 2, 2019

(30) Foreign Application Priority Data

Oct. 31, 2017 (JP) ................................ 2017-210900

(51) Int. Cl.
*H01L 23/433* (2006.01)
*H01L 23/00* (2006.01)
*H02M 7/5387* (2007.01)

(52) U.S. Cl.
CPC .......... *H01L 23/4334* (2013.01); *H01L 24/48* (2013.01); *H02M 7/5387* (2013.01); *H01L 24/45* (2013.01)

(58) Field of Classification Search
None
See application file for complete search history.

(56) References Cited

U.S. PATENT DOCUMENTS

| | | | | |
|---|---|---|---|---|
| 2006/0022326 | A1* | 2/2006 | Morita | H01L 23/4928 257/692 |
| 2007/0035019 | A1* | 2/2007 | Carney | H01L 23/3121 257/734 |
| 2012/0034716 | A1* | 2/2012 | Lin | H01L 33/58 438/27 |
| 2012/0061819 | A1* | 3/2012 | Siemieniec | H01L 23/3107 257/734 |
| 2012/0112368 | A1* | 5/2012 | Gorai | B81C 1/0023 257/782 |
| 2015/0221626 | A1* | 8/2015 | Motowaki | H01L 24/73 257/712 |
| 2018/0240728 | A1* | 8/2018 | Konno | H01L 23/36 |

FOREIGN PATENT DOCUMENTS

JP 2017-005037 A 1/2017

\* cited by examiner

*Primary Examiner* — Dung A. Le
(74) *Attorney, Agent, or Firm* — Studebaker & Brackett PC

(57) ABSTRACT

A semiconductor module includes: a semiconductor device having an upper surface electrode; a conductor plate joined to the upper surface electrode via a bonding member; and a wire bonded to the conductor plate, wherein the wire is a metal thread or a ribbon bond, and the bonding member is a porous sintered metal material impregnated with resin.

20 Claims, 3 Drawing Sheets

SEMICONDUCTOR MODULE, METHOD FOR MANUFACTURING THE SAME AND ELECTRIC POWER CONVERSION DEVICE

BACKGROUND OF THE INVENTION

Field

The present invention relates to a semiconductor module including a semiconductor device with metal threads or ribbon bonds bonded thereto, a method for manufacturing the same, and an electric power conversion device.

Background

Due to increasing environmental regulations in recent years, demands are rising for high-quality, high-efficiency, and energy-saving electronic equipment that take environmental issues into consideration. Particularly in demand are electronic equipment for high-power applications, such as industrial machines, drive controllers for motor-driven domestic appliances, in-vehicle controllers for electric or hybrid cars, controllers for railway vehicles, and controllers for solar generators. Other desired requirements for electronic equipment include higher efficiency and lower losses during operation in high-load applications such as high-temperature environments. High-temperature environment refers to an environment with a temperature of 150° C. to 175° C. or more, such as 200° C., for example. Semiconductor devices that operate under such high temperatures are being developed. There is also a trend toward higher current densities as package characteristics.

Energy-saving performance in high-temperature environments is required particularly in electronic equipment for use as in-vehicle or railway controllers. The temperature in conventional operation is normally 150° C. or lower, for example, but the demands are rising for use in an environment of an even higher temperature such as 200° C. or more. In applications under high temperatures of 200° C. or more, SiC or GaN wide-bandgap semiconductor devices are used instead of Si devices, since SiC or GaN devices can be controlled with even lower losses and higher efficiency.

There is thus the need to review the materials and structures of electronic equipment in order to minimize switching losses to reduce losses and increase efficiency in the operations under high temperature environments. Wire connecting portions on the upper surface of semiconductor devices applied to electronic equipment are particularly prone to degrade and adversely affect the life of the semiconductor module. How to improve the quality and reliability, and to extend the life, of the wire connecting portions is a big issue.

Application of Cu wires instead of Al wires has been considered in recent years in order to increase current density and to improve reliability. However, Cu is harder than Al and can sometimes cause damage to the semiconductor devices during wire bonding. The application of Cu wires that are capable of conducting high-density current is essential for semiconductor modules including SiC or GaN semiconductor devices mounted thereon for high-temperature applications.

Making the upper surface electrodes thicker to alleviate the possible damage is difficult due to process limitations and would lead to a significant cost increase. Therefore, one option that has been considered is to bond wires to conductor plates that are joined to the upper surface electrodes of the semiconductor devices, instead of bonding wires directly to the upper surface electrodes of the semiconductor devices. To ensure that a reliable bond is formed, however, a large load and ultrasonic vibration need to be applied by wedge bonding. Thus, the semiconductor devices are sometimes damaged during wire bonding via the conductor plates and bonding members. The bonding member used for bonding the upper surface electrodes and conductor plates is usually solder. However, Pb-free solder that has come to be used has a large elastic modulus of 40 to 50 GPa. As an alternative, use of porous sintered material for the bonding member has been proposed (See, for example, Japanese Patent Application Laid-open No. 2017-005037).

SUMMARY

However, conventional porous sintered bonding material could not sufficiently reduce the damage to semiconductor devices during wire bonding. The problem associated with the use of Cu wires mentioned above was particularly evident since Cu wire expected to increase the current density is a hard material. The consequent problem was that the reliability and life duration of the semiconductor modules used under high temperatures and with high current density were compromised.

The present invention was made to solve the problems described above and it is an object of the invention to obtain a highly reliable and long-life semiconductor module, a method for manufacturing the same, and an electric power conversion device.

According to the present invention, a semiconductor module includes: a semiconductor device having an upper surface electrode; a conductor plate joined to the upper surface electrode via a bonding member; and a wire bonded to the conductor plate, wherein the wire is a metal thread or a ribbon bond, and the bonding member is a porous sintered metal material impregnated with resin.

In present invention, a porous sintered metal material impregnated with resin is used as the bonding member that bonds the upper surface electrode of the semiconductor device and the conductor plate. As the bonding member has lower elasticity than materials not impregnated with resin, the possibility of damaging the semiconductor device during wire bonding can be reduced. Consequently, a highly reliable, long-life semiconductor module suitable for high-temperature and high-current-density applications can be obtained.

Other and further objects, features and advantages of the invention will appear more fully from the following description.

DESCRIPTION OF EMBODIMENTS

A semiconductor module, a method for manufacturing the same, and an electric power conversion device according to the embodiments of the present invention will be described with reference to the drawings. The same components will be denoted by the same symbols, and the repeated description thereof may be omitted.

First Embodiment

Figure 1:
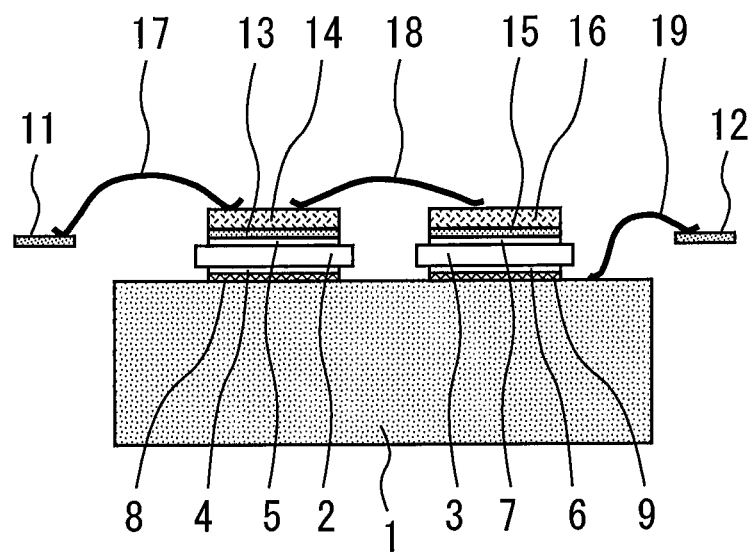
FIG. 1 is a cross-sectional view of a semiconductor module according to according to a first embodiment.

FIG. 1 is a cross-sectional view of a semiconductor module according to according to a first embodiment. A heat dissipation plate 1 is a 30 to 300 mm square, 3 to 20 mm thick heat dissipation plate made of a Cu, Cu alloy composite material, Al or Al alloy composite material with a high heat capacity. The heat dissipation plate 1 is connected to a heat sink having multiple fins, or a water cooling jacket, via heat dissipating grease. Alternatively, the heat dissipation plate 1 itself may be a heat sink having multiple fins on the under side, or may be integrated with a water cooling jacket. A circuit is formed on a device mounting surface of the heat dissipation plate 1. The heat dissipation plate 1 may be an integrally-formed type having an insulating material embedded inside, or the circuit may be integrated by heat application or pressing.

Semiconductor devices 2 and 3 are mounted on the heat dissipation plate 1. The semiconductor devices 2 and 3 are 3 to 18 mm in side length. The semiconductor device 2 is an IGBT, and the semiconductor device 3 is a diode. A lower surface electrode 4 of the semiconductor device 2 is a collector electrode, and an upper surface electrode 5 is an emitter electrode. A lower surface electrode 6 of the semiconductor device 3 is a cathode electrode, and the upper surface electrode 7 is an anode electrode. The electrodes are each formed by sputtering or plating and made of a material mainly composed of Al, Au, Ag, or Cu. Each electrode is metallized with Ti—Ni—Au, Ag, or the like. The semiconductor device 2 is not limited to IGBT and may be other power conversion switching elements such as MOSFETs. The lower surface electrodes 4 and 6 of the semiconductor devices 2 and 3 are electrically connected to the circuit of the heat dissipation plate 1 via bonding members 8 and 9.

A conductor plate 14 is joined to the upper surface electrode 5 of the semiconductor device 2 via a bonding member 13. A conductor plate 16 is joined to the upper surface electrode 7 of the semiconductor device 3 via a bonding member 15. One end of a wire 17 is bonded to the conductor plate 14 by application of load and ultrasonic vibration. The other end of the wire 17 is bonded to a terminal 11. One end of a wire 18 is bonded to the conductor plate 14, and the other end of the wire 18 is bonded to the conductor plate 16. The heat dissipation plate 1 and a terminal 12 are connected by a wire 19.

The wires 17, 18, and 19 are a plurality of metal threads mainly composed of Cu, for example. The wires 17, 18, and 19 may have a diameter ranging from 300 to 500 µm selected in accordance with the current specifications of the semiconductor module. The wires 17, 18, and 19 may alternatively be flat ribbon bonds of 0.1 to 0.5 mm thickness. Ribbon wires can carry a higher current with a lower resistance, and the amount of self-heating can be reduced. The terminals 11 and 12 are AC terminals for input/output with external devices and connected to an electric machine such as a motor, battery, or harness. A signal terminal is connected to the gate electrode of the semiconductor device 2 for control signals to be input from outside. The gate electrode may also have a structure similar to that with the bonding member 13 and conductor plate 14, but the connection between the signal terminal and the gate terminal can be established by normal wire bonding since only a small current flows through the gate electrode.

The bonding members 8, 9, 13, and 15 are made of porous sintered metal impregnated with resin such as polyimide or epoxy. The metal material is mainly composed of Ag, Cu, Sn—Cu, Ni—Sn, Ag—Sn, Au—Sn, Ag—In, or compounds of Ag—In and the like processed to have high heat resistance to withstand temperatures of 400° C. or more. Thus the bonding members can be applied to semiconductor modules mounted with SiC devices capable of operating in high temperature. The bonding members 13 and 15 are sintered by applying heat, with a heat resistant film placed on the chips, with or without pressure applied as required.

The bonding members 8, 9, 13, and 15 are either composed of nano-size fine metal particles, solvent, and surface stabilizer, or formed as a sheet-like member mainly made of Sn or In. Therefore, the bonding members 13 and 15 can readily be tacked to the conductor plates 14 and 16, and also, the bond thickness can easily be controlled to be uniform, in consideration of the effects on the semiconductor devices 2 and 3 during wire bonding. If these are sheet-like members rather than paste-like members, the thickness thereof can be controlled to be uniform. The bonding members 13 and 15 have a thickness of 10 to 300 µm, which is set in consideration of possible damage to the semiconductor devices 2 and 3. The bonding members 13 and 15 have a sufficiently high heat conductivity, so that their heat resistance is negligible.

By impregnating porous sintered metal with low-elasticity resin, bonding members 8, 9, 13, and 15 with low elasticity having an elastic modulus of 10 GPa or less can be obtained. This elastic modulus is one fourth to one fifth of, or even lower than, that of porous sintered material alone.

The semiconductor device 2 is turned on or off by control signals input from outside via the signal terminal. The heat generated by the operation of the semiconductor devices 2 and 3 is dissipated to the outside via the heat dissipation plate 1. Temperature rise of the semiconductor devices 2 and 3 is thus suppressed to reduce heat conducted to the wires 17 and 18, so that long-life wire connection can be ensured.

In this embodiment, a porous sintered metal material impregnated with resin is used as the bonding members 13 and 15 that bond the upper surface electrodes 5 and 7 of the semiconductor devices 2 and 3 and the conductor plates 14 and 16. These bonding members 13 and 15 have an elastic modulus of 10 GPa or less. As the bonding members 13 and 15 have lower elasticity than materials not impregnated with resin, the possibility of damaging the semiconductor devices 2 and 3 during wire bonding can be reduced. Wires 17 and 18 made of Cu, which is a harder material than conventional Al, can also be bonded. Consequently, a highly reliable, long-life semiconductor module suitable for high-temperature and high-current-density applications can be obtained.

The conductor plates 14 and 16 are made of Cu or Cu alloy. The conductor plates 14 and 16 may have a thickness of 0.1 to 3 mm, which depends on the heat capacity to accommodate the heat generated by the high-current-conducting semiconductor devices 2 and 3, and the energy input to the conductor plates 14 and 16 during wire bonding. The conductor plates 14 and 16 may also be multilayer plates. Such multilayer conductor plates 14 and 16 will absorb the impact during wire bonding in a cushion-like manner and will be able to further reduce the possibility of damaging the semiconductor devices 2 and 3.

Since the semiconductor devices 2 and 3 repeat switching and generate heat, they are mounted on the heat dissipation plate 1 that has necessary heat capacity and heat-dissipating property. Thus desired switching functionality can be obtained with reduced losses. Since the heat conducted to the wires 17 and 18 is also reduced, the bonded portions can have a longer life.

With the conventional coating or screen printing of a paste-like bonding material on the semiconductor devices 2 and 3, the production efficiency was very poor, and positioning of the conductor plates 14 and 16 was difficult. Here, the conductor plate 14 and bonding member 13 are formed integrally in one piece before the assembly. Similarly, the conductor plate 16 and bonding member 15 are formed integrally. The bonding members 13 and 15 made of a porous sintered metal material impregnated with resin can be temporarily tacked at a low temperature of 100° C. or less. After the semiconductor device 2 has been bonded on the heat dissipation plate 1, the integral piece of the conductor plate 14 and bonding member 13 is bonded thereto by application of heat, with or without pressure as required. Alternatively, the semiconductor device 2 is placed on the heat dissipation plate 1, and the integral piece is put thereon, and heat is applied, with or without pressure as required, to bond them together at the same time. The same applies to the semiconductor device 3. With the use of such integral pieces, the positioning is made easy, the number of process steps is decreased, and the productivity is improved. Moreover, when the semiconductor module includes a plurality of bonding members therein, their thickness can be made uniform, so that the reliability after the bonding can be improved.

Second Embodiment

Figure 2:
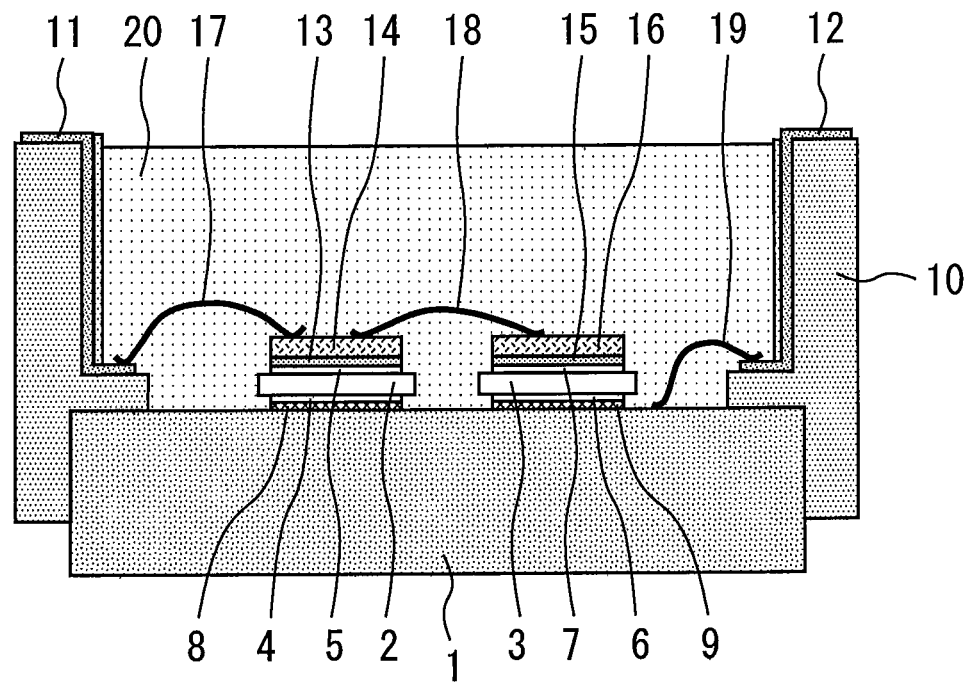
FIG. 2 is a cross-sectional view illustrating a semiconductor module according to a second embodiment.

FIG. 2 is a cross-sectional view illustrating a semiconductor module according to a second embodiment. In this embodiment, a case 10 that forms the outer shell of the semiconductor module is bonded with an adhesive or the like along the outer edges of the heat dissipation plate 1. The case 10 surrounds the semiconductor devices 2 and 3 and others. The case 10 is made of resin such as PPS or PBT, and formed integrally with terminals 11 and 12 and signal terminals (not shown). These terminals are made of copper or copper alloy and have about 1 mm thickness.

The interior of the case 10 is sealed with a sealing material 20 that is either an epoxy-based resin or gel-like silicone resin. Thus the semiconductor devices 2 and 3, terminals 11 and 12, conductor plates 14 and 16, and wires 17, 18, and 19 are insulated from each other.

A control board having a drive circuit and a protection circuit may also be sealed inside the case 10. The control board may be connected to the signal terminals and supply control signals to the semiconductor device 2 for the switching. The control board may be supported by the signal terminals and disposed above the heat dissipation plate 1 substantially parallel thereto. Other features and effects are similar to those of the first embodiment.

Third Embodiment

Figure 3:
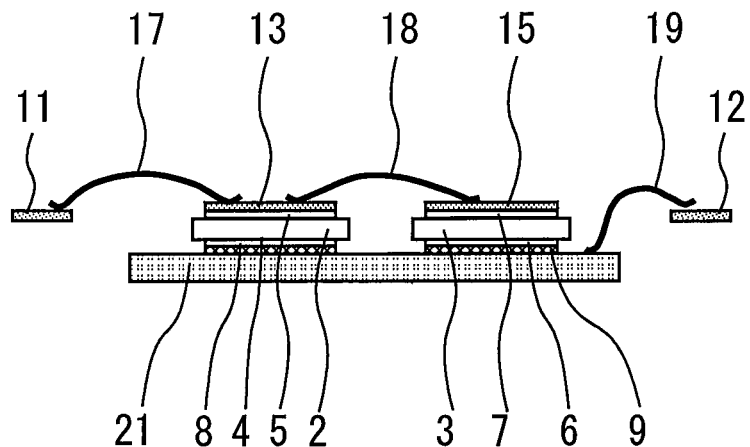
FIG. 3 is a cross-sectional view illustrating a semiconductor module according to a third embodiment.

FIG. 3 is a cross-sectional view illustrating a semiconductor module according to a third embodiment. In this embodiment, as compared to the first embodiment, the conductor plates 14 and 16 are not provided, and the wires 17 and 18 are directly bonded to the bonding members 13 and 15. The bonding members 13 and 15 are porous sintered metal materials. Since the porous sintered metal materials are metal blocks, the wires 17 and 18 can be directly bonded to them. The number of process steps and costs are reduced because the conductor plates 14 and 16 are not provided. Preferably, the bonding members 13 and 15 are made of a porous sintered material impregnated with resin so that the bonding members 13 and 15 have lower elasticity and possible damage to the semiconductor devices 2 and 3 during wire bonding can be suppressed. If the porous sintered material is Cu, a high-quality, highly reliable bond can be obtained between the Cu-based wires 17 and 18 and Cu bonding members.

In order to absorb the impact during wire bonding with the bonding members 13 and 15 on the semiconductor devices 2 and 3, the semiconductor devices 2 and 3 can be mounted on an insulating substrate 21 instead of on the heat dissipation plate 1. The insulating substrate 21 is made of $Si_3N_4$ that has high strength. Alternatively, the substrate may be made of AlN having high heat conductivity, or $Al_2O_3$. Other features and effects are similar to those of the first embodiment.

Fourth Embodiment

Figure 4:
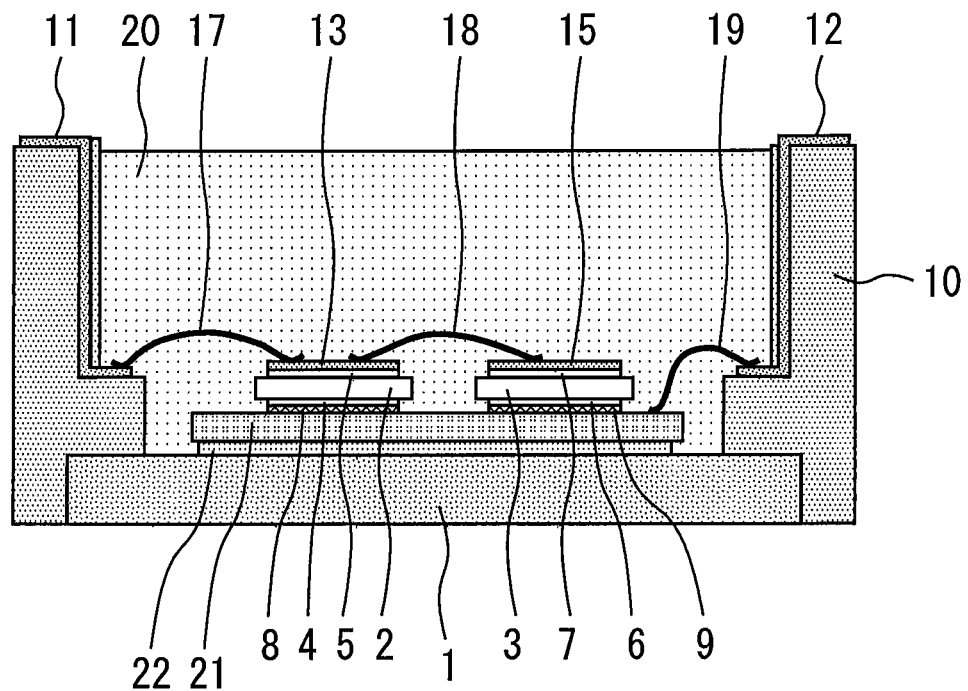
FIG. 4 is a cross-sectional view illustrating a semiconductor module according to a fourth embodiment.

FIG. 4 is a cross-sectional view illustrating a semiconductor module according to a fourth embodiment. In this embodiment, the insulating substrate 21 is bonded on the heat dissipation plate 1 having heat-dissipating properties via a bonding member 22. The case 10 is bonded along outer peripheral edges of the heat dissipation plate 1 by an adhesive or the like. The case 10 surrounds the semiconductor devices 2 and 3 and others. The case 10 is formed integrally with the terminals 11 and 12 and signal terminals (not shown). The interior of the case 10 is sealed with the sealing material 20 that is either an epoxy-based resin or gel-like silicone resin. Bonding with hard Cu wires is possible in this case, too. Other features and effects are similar to those of the third embodiment.

The semiconductor devices 2 and 3 are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. The semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved. Both the semiconductor devices 2 and 3 are desirably formed of a wide-bandgap semiconductor. However, only one of them may be formed of a wide-bandgap semiconductor. Also in this case, the advantageous effects described in the above described embodiments can be obtained.

Fifth Embodiment

In this embodiment, the semiconductor modules according to the first to fourth embodiments described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 5:
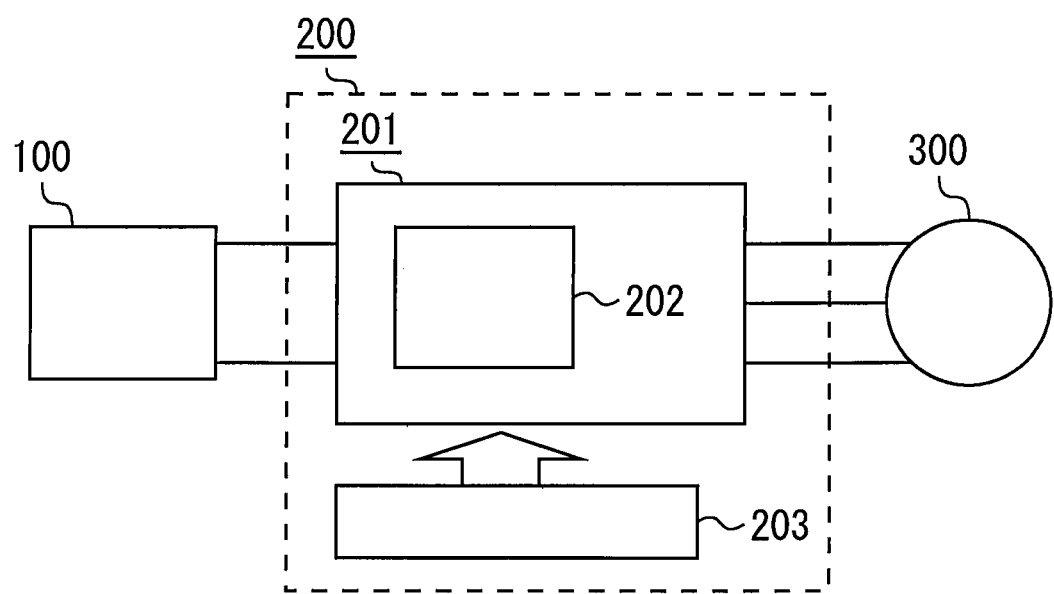
FIG. 5 is a block diagram illustrating a configuration of an electric power conversion system to which the electric power conversion device according to the fifth embodiment is applied.

FIG. 5 is a block diagram illustrating a configuration of an electric power conversion system to which the electric power conversion device according to the fifth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that converts DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor module 202 corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor module 202. Another drive circuit different from the semiconductor module 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor modules according to the first to fourth embodiments are applied as the semiconductor module 202. Accordingly, a highly reliable and long-life electric power conversion device can be obtained.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-210900 filed on Oct. 31, 2017 including specification, claims, drawings and summary, on which the Convention priority of the present application is based, is incorporated herein by reference in its entirety.

The invention claimed is:

1. A semiconductor module comprising:
   a semiconductor device having an upper surface electrode;
   a conductor plate joined to the upper surface electrode via a bonding member; and
   a wire bonded to the conductor plate,
   wherein the wire is a metal thread or a ribbon bond, and the bonding member is a porous metal material that is sintered before being impregnated with resin.

2. The semiconductor module according to claim 1, wherein the conductor plate is a multilayer plate.

3. The semiconductor module according to claim 1, wherein the wire is mainly composed of Cu.

4. The semiconductor module according to claim 1, further comprising a heat dissipation plate on which the semiconductor device is mounted.

5. The semiconductor module according to claim 1, further comprising an insulating substrate on which the semiconductor device is mounted.

6. The semiconductor module according to claim 1, wherein the semiconductor device is made of a wide-band-gap semiconductor.

7. An electric power conversion device comprising:
a main conversion circuit including the semiconductor module according to claim 1, converting input power and outputting the converted power; and
a control circuit outputting a control signal for controlling the main conversion circuit to the main conversion circuit.

8. A semiconductor module comprising:
a semiconductor device having an upper surface electrode;
a bonding member joined to the upper surface electrode; and
a wire directly bonded to the bonding member, wherein
the wire is a metal thread or a ribbon bond, and
the bonding member is a porous metal material that is sintered before being impregnated with resin.

9. The semiconductor module according to claim 8, wherein the wire is mainly composed of Cu, and the porous sintered material is Cu.

10. The semiconductor module according to claim 8, further comprising a heat dissipation plate on which the semiconductor device is mounted.

11. The semiconductor module according to claim 8, further comprising an insulating substrate on which the semiconductor device is mounted.

12. The semiconductor module according to claim 8, wherein the semiconductor device is made of a wide-bandgap semiconductor.

13. An electric power conversion device comprising:
a main conversion circuit including the semiconductor module according to claim 8, converting input power and outputting the converted power; and
a control circuit outputting a control signal for controlling the main conversion circuit to the main conversion circuit.

14. A method for manufacturing a semiconductor module comprising:
integrally forming a conductor plate and a bonding member in one piece;
joining the conductor plate to an upper surface electrode of a semiconductor device via a bonding member; and
bonding a wire to the conductor plate, wherein
the wire is a metal thread or a ribbon bond, and
the bonding member is a porous metal material that is sintered before being impregnated with resin.

15. The semiconductor module according to claim 1, wherein
the porous sintered metal material being impregnated with resin creates a material having a lower elasticity than that of the porous sintered metal material.

16. The semiconductor module according to claim 1, wherein
the resin is polyimide or epoxy.

17. The semiconductor module according to claim 8, wherein
the porous sintered metal material being impregnated with resin creates a material having a lower elasticity than that of the porous sintered metal material.

18. The semiconductor module according to claim 8, wherein
the resin is polyimide or epoxy.

19. The method for manufacturing a semiconductor module according to claim 14, wherein
the porous sintered metal material being impregnated with resin creates a material having a lower elasticity than that of the porous sintered metal material.

20. The method for manufacturing a semiconductor module according to claim 14, wherein
the resin is polyimide or epoxy.

* * * * *